United States Patent
Khawand et al.

(10) Patent No.: US 10,756,695 B2
(45) Date of Patent: Aug. 25, 2020

(54) MULTI-SIDED ELECTROMAGNETIC COIL ACCESS ASSEMBLY

(71) Applicant: Microsoft Technology Licensing, LLC, Redmond, WA (US)

(72) Inventors: Charbel Khawand, Sammamish, WA (US); Sidharath Jain, Bellevue, WA (US); Toby James Morris, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 248 days.

(21) Appl. No.: 15/903,515

(22) Filed: Feb. 23, 2018

(65) Prior Publication Data
US 2019/0267963 A1 Aug. 29, 2019

(51) Int. Cl.
| | | |
|---|---|---|
| *H03H 7/38* | (2006.01) | |
| *H02J 7/02* | (2016.01) | |
| *H02J 7/00* | (2006.01) | |
| *G06F 1/16* | (2006.01) | |
| *H02J 50/10* | (2016.01) | |

(52) U.S. Cl.
CPC ............. *H03H 7/38* (2013.01); *G06F 1/1618* (2013.01); *G06F 1/1656* (2013.01); *G06F 1/1681* (2013.01); *G06F 1/1698* (2013.01); *H02J 7/0042* (2013.01); *H02J 7/025* (2013.01); *H02J 50/10* (2016.02)

(58) Field of Classification Search
CPC .......... H03H 7/38; H02J 50/10; H02J 7/0042; H02J 7/025; G06F 1/161; G06F 1/1681; G06F 1/1698; G06F 1/1656
See application file for complete search history.

(56) References Cited

U.S. PATENT DOCUMENTS

| | | | |
|---|---|---|---|
| 8,169,185 B2 * | 5/2012 | Partovi | H02J 50/40 320/108 |
| 9,252,628 B2 | 2/2016 | Leabman et al. | |

(Continued)

OTHER PUBLICATIONS

"International Search Report and Written Opinion Issued in PCT Application No. PCT/US2019/017736", dated Apr. 24, 2019, 11 Pages.

(Continued)

*Primary Examiner* — Aurel Prifti
(74) *Attorney, Agent, or Firm* — Holzer Patel Drennan

(57) ABSTRACT

An example implementation provides a computing device including a first computing device portion having one or more electrical components, a first side, a second side, an electromagnetic coil, and a first metal frame having a first through-slot. The computing device also a second computing device portion having one or more other electrical components, a third side, a fourth side and a second metal frame having a second through-slot. A mechanical joint connects the first computing device portion and the second computing device portion such that the first side is positioned to face the third side and the electromagnetic coil overlaps the first through-slot and the second through-slot along an axis running orthogonal to the first computing device portion and the second computing device portion. Control circuitry adjusts matching to compensate different physical configurations, and firmware switches the radiofrequency configuration.

21 Claims, 8 Drawing Sheets

(56) References Cited

U.S. PATENT DOCUMENTS

| | | | |
|---|---|---|---|
| 9,478,863 B2 | 10/2016 | Kanj et al. | |
| 9,673,634 B2* | 6/2017 | Baarman | H02J 7/0027 |
| 9,680,202 B2* | 6/2017 | Irci | H01Q 1/243 |
| 10,420,235 B2* | 9/2019 | Park | G06F 1/1656 |
| 2012/0290760 A1* | 11/2012 | McCormack | H01Q 1/2283 |
| | | | 710/303 |
| 2014/0253024 A1* | 9/2014 | Rautiainen | H02J 7/025 |
| | | | 320/108 |
| 2015/0015443 A1* | 1/2015 | Lee | H01Q 1/243 |
| | | | 343/702 |
| 2015/0349571 A1* | 12/2015 | Wagman | H02J 7/025 |
| | | | 320/108 |
| 2016/0006109 A1* | 1/2016 | Apaydin | H01Q 5/328 |
| | | | 343/702 |
| 2016/0164563 A1* | 6/2016 | Khawand | H04B 1/3838 |
| | | | 455/127.2 |
| 2016/0261022 A1 | 9/2016 | Guterman et al. | |
| 2016/0329751 A1* | 11/2016 | Mach | H02J 50/20 |
| 2016/0336809 A1* | 11/2016 | Gluzman | H02J 50/90 |
| 2017/0077597 A1 | 3/2017 | Gong et al. | |
| 2017/0103849 A1 | 4/2017 | Leem | |
| 2017/0141820 A1* | 5/2017 | Kim | H04B 1/40 |
| 2017/0237149 A1* | 8/2017 | Lee | H01Q 1/243 |
| | | | 361/679.21 |
| 2017/0364220 A1* | 12/2017 | Karl | H04N 5/232 |
| 2018/0012691 A1* | 1/2018 | Lauder | G06F 1/1601 |
| 2018/0144861 A1* | 5/2018 | Song | H04B 5/0037 |
| 2018/0198308 A1* | 7/2018 | Files | G06F 1/1618 |

OTHER PUBLICATIONS

Strömmer, et al., "NFC-enabled Wireless Charging", In Proceedings of 4th International Workshop on Near Field Communication, Mar. 13, 2012, 7 Pages.

* cited by examiner

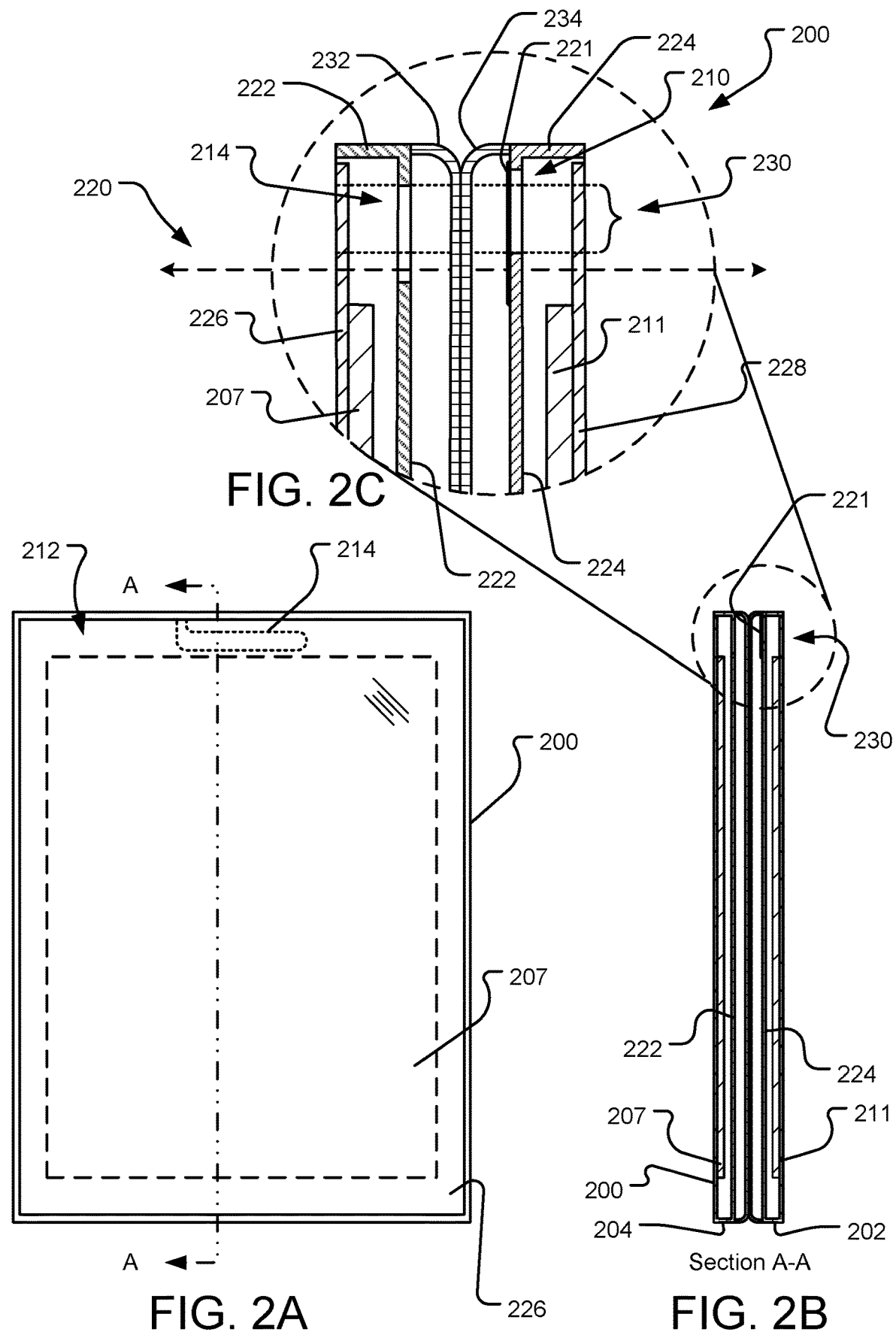

MULTI-SIDED ELECTROMAGNETIC COIL ACCESS ASSEMBLY

BACKGROUND

Some computing devices are available in foldable form factors that allow a device to be used in multiple physical configurations. For example, in one implementation, a computing device may have a display on two halves, wherein the two halves are separated by a hinge. In one physical configuration, the computing device may be used in a closed position (0°), wherein the displays on the two halves are folded about the hinge to face each other. In another configuration, the computing device may be used in an open position (180°), wherein the computing device is opened flat (e.g., on a table top) with the displays facing in the same direction (e.g., away from the tabletop). In a third configuration, the computing device may be used in a reverse-closed position (360°), wherein the displays on the two halves are folded about the hinge to face away from each other. Other configurations may position the halves in different angular orientations with respect to each other, such as at a 90° angle resembling a laptop computer configuration although other angles are also possible. Other form factors may provide very different physical configurations, including without limitation configurations including more than two device portions, a display half and a non-display half, sliding interfaces between device portions, and non-hinge interfaces.

The multiple physical configurations present a challenge when designing magnetic access to electromagnetic coils inside a computing device, particularly in the presence of metal casing, metal framing, and other metal components. The multiple physical configurations present an opportunity to use Near Field Communications (NFC) and inductive charging from multiple sides of the computing device in various physical configurations. Such metal structures, however, can fatally diminish operations that rely on internal electromagnetic coils. In fact, some designs have layered a ferrite sheet (or other material with high permeability) between an electromagnetic coil and such a metal structure to mitigate the degradation of the magnetic field by the metal structure, which acts as a ground plane. However, such a high permeability material limits omnidirectional performance of the coil, which is unsatisfactory for multi-configuration devices.

SUMMARY

The described technology addresses one or more of the foregoing problems by providing multi-sided magnetic access to an electromagnetic coil of a multi-configuration computing device in the presence of one or more metal structures, such as a conductive (e.g., metal, graphite) computer device chassis or midframe. An example implementation provides a computing device including a first computing device portion having one or more electrical components, a first side, a second side, an electromagnetic coil, and a first metal frame having a first through-slot. The computing device also a second computing device portion having one or more other electrical components, a third side, a fourth side and a second metal frame having a second through-slot. A mechanical joint connects the first computing device portion and the second computing device portion such that the first side is positioned to face the third side and the electromagnetic coil overlaps the first through-slot and the second through-slot along an axis running orthogonal to the first computing device portion and the second computing device portion. Control circuitry adjusts matching to compensate for different physical configurations, and firmware switches the radiofrequency configuration, including without limitation drive voltage, Amplitude Load Modulation (ALM) phase synchronization, DLMA (dynamic load modulation amplitude), and DPC (dynamic power control) as they change between different physical configurations.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

FIGS. 1A, 1B, 1C, and 1D illustrate example physical configurations of a computing device having multi-sided electromagnetic coil access.

FIGS. 2A, 2B, and 2C illustrate multiple views of an example computing device having multi-sided electromagnetic coil access in a reverse-closed position.

FIGS. 8A, 8B, 8C, and 8D illustrate various slot and coil designs in a computing device having multi-sided electromagnetic coil access.

DETAILED DESCRIPTIONS

Figure 1A:
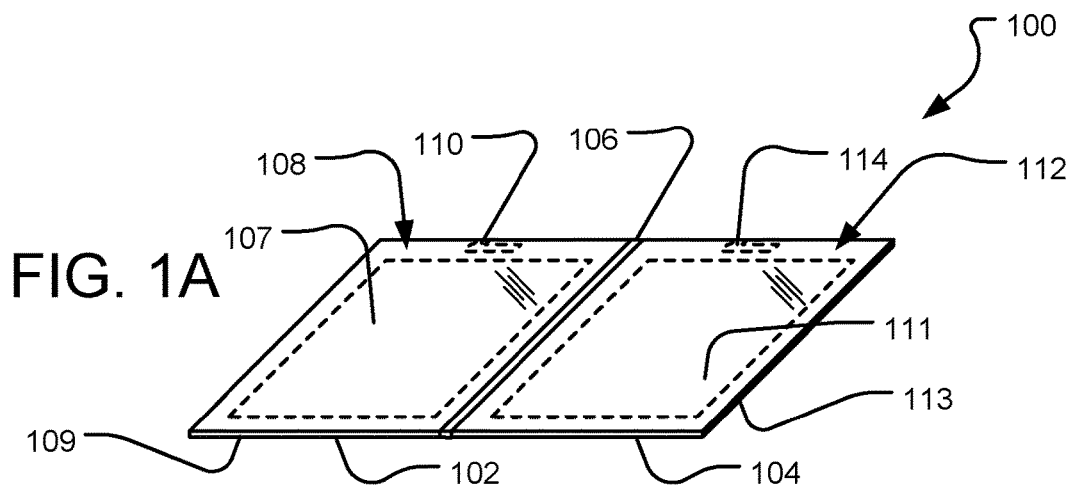

FIGS. 1A, 1B, 1C, and 1D illustrate example physical configurations of a computing device 100 having multi-sided electromagnetic coil access. FIG. 1A depicts the computing device 100 having two display halves 102 and 104 connected by a mechanical joint 106. The mechanical joint may be in the form of a foldable hinge, a rolling hinge, a flexible connector, a combination of these options, or other mechanical joint components. A display 107 is positioned on one side of the display half 102, and a display 111 is positioned on one side of the display half 104. The display half 102 also has an opposing side 109, and the display half 104 also has an opposing side 113. Each display half includes a metal structure that can act as a ground plane or shield relative to an electromagnetic coil position in one of the display halves. In FIG. 1A, the computing device 100 is physically configured in a full-open position (e.g., the two display halves are positioned at a 180° angle from each other) with the displays 107 and 111 facing in the same direction.

Figure 1B:
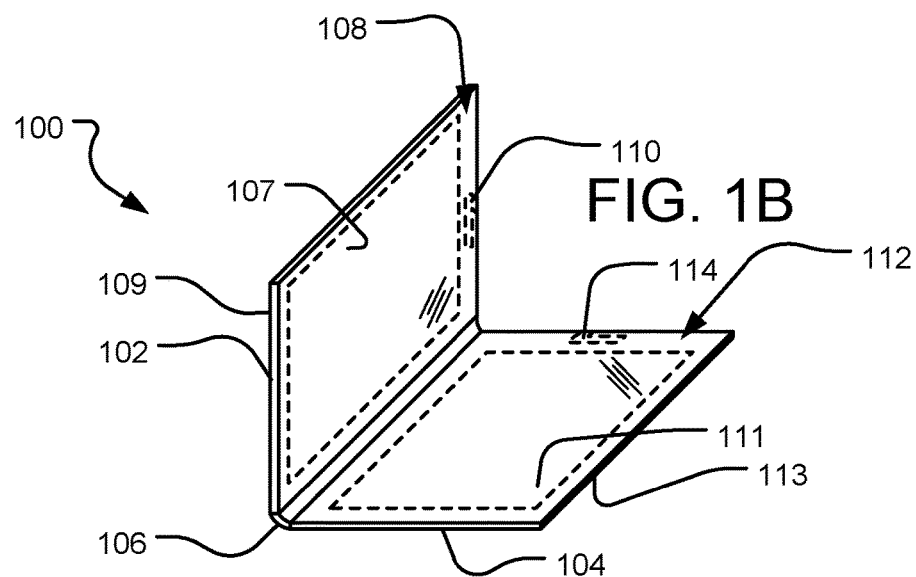

FIG. 1B depicts the computing device 100 having the two display halves 102 and 104 connected by the mechanical joint 106. In FIG. 1B, the computing device 100 is physically configured in a partially-open position (e.g., the two display halves are positioned at an angle between 0° and 180° from each other). An alternative partially-open position may provide the two display halves being positioned at an angle between 180° and 360° from each other).

Figures 1C, 1D:
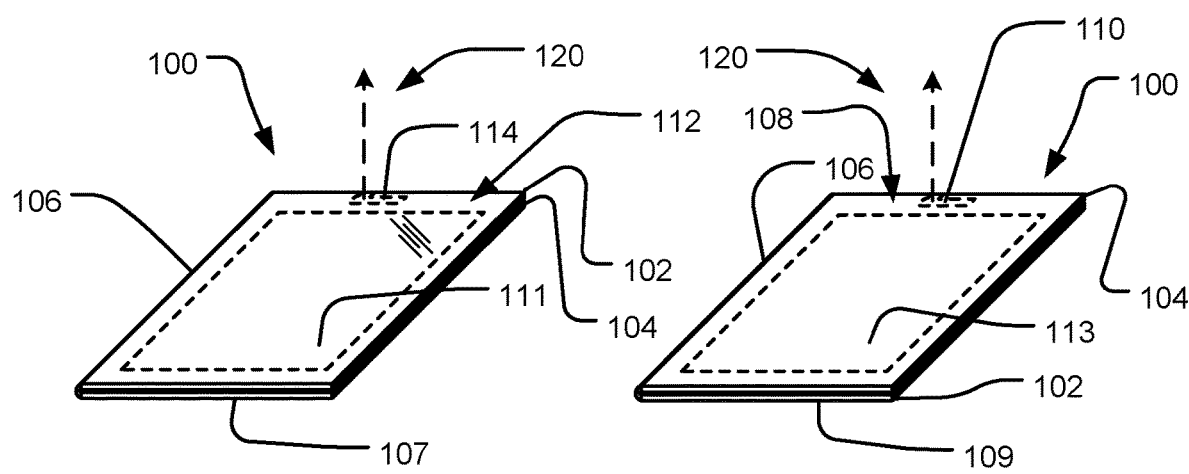

FIG. 1C depicts the computing device 100 having the two display halves 102 and 104 connected by the mechanical joint 106. In FIG. 1C, the computing device 100 is physically configured in a reverse-closed position (e.g., the two display halves are positioned at an angle between 0° from each other, with the displays 107 and 111 facing away from other).

FIG. 1D depicts the computing device 100 having the two display halves 102 and 104 connected by the mechanical joint 106. In FIG. 1D, the computing device 100 is physically configured in a closed position (e.g., the two display halves are positioned at an angle between 0° from each other, with the displays 107 and 111 facing each other).

In each of the physical configurations of FIGS. 1A, 1B, 1C, and 1D, the displays 107 and 111 leave clearances 108 and 112 between each display and an adjacent edge of the corresponding display half to allow for a non-shielding through-channel (e.g., see through-channels 110 and 114) through each display half. Each through-channel is aligned with each other and an electromagnetic coil (not shown) so that the electromagnetic coil overlaps (either totally or partially) each through-channel overlaps each other along an axis 120 that is orthogonal to the surface of each display half when the computing device 100 is physically configured in a closed position (see FIG. 1C) or a reverse-closed position (see FIG. 1D). In this manner, the non-shielding through-channel allows a magnetic field to access the electromagnetic coil from either side of the closed or reverse-closed computing device 100. As such, operations involving the electromagnetic coil, such as Near Field Communications (NFC) or inductive charging, can be applied from either side of the closed or reverse-closed computing device 100. It should be understood that the term "overlapping" refers to the areas of the electromagnetic coil and the through-slots overlapping partially or totally along an orthogonal axis. Total overlapping means that an area of one structure overlaps all of the area of another structure. Partial overlapping means that an area of one structure overlaps only part of the area of another structure.

FIGS. 2A, 2B, and 2C illustrate multiple views of an example computing device 200 having multi-sided electromagnetic coil access in a reverse-closed position. In FIG. 2A, a plan view depicts the computing device 200, including a display 207 under a cover glass of a computing device portion 204, configured in a reverse-closed position so that the display sides are facing outward. A dashed-line through-slot 214 is shown an example extent of the display 207, which leaves a clearance 212 near an edge of the computing device 200. The through-slot 214 is formed or cut through a metal frame 222 in the portion of the computing device 200 shown in FIGS. 2A, 2B, and 2C. Each through-slot may be open or closed, as described with regard to FIG. 8. An electromagnetic coil (not shown in FIG. 2A, but shown as electromagnetic coil 221 in FIGS. 2B and 2C) is positioned to overlap the through-slot 214 along an axis that is orthogonal to the side of the computing device portion 204 shown in FIG. The electromagnetic coil 221 and the through-slot 214 also overlap (along the same axis) a through-slot (not shown in FIG. 2A, but shown in FIG. 2C as through-slot 210) formed or cut through a metal frame 224 in a second computing device portion (not shown in FIG. 2A, but shown in FIGS. 2B and 2C as computing device portion 202).

In FIG. 2B, a cross-sectional view of section A-A shows the two computing device portions 202 and 204 in a physical configuration of a reverse-closed position. The display 207 and a metal frame 222 in the computing device portion 204 and a display 211 and a metal frame 224 in the computing device portion 202 span a large area of the computing device portions 202 and 204 when viewed from the perspective of FIG. 2A. The display 207 is covered by a cover glass 226, and the display 211 is covered by a cover glass, identified as cover glass 228 in FIG. 2C. The metal frames 222 and 224 form part of a computing device chassis, although other or alternative structures may be employed.

As shown in FIG. 2C, the electromagnetic coil 221 overlaps the through-slots 210 and 214 along an axis orthogonal to the first and second computing device portions 202 and 204 when the computing device 200 is in the physical configuration of a closed position or a reverse-closed position. Further, the cover glass 226 and 228 and exterior casing 232 and 234 shown in FIG. 2C are formed of substantially (magnetically) non-shielding materials. It should be understood that the cover glass 226 and 228 could be replaced with other materials as structures, such as plastic materials or even metal, graphite or other conductive structures having through-slots similar to those provided in metal frames 222 and 224 to provide a through-channel to the electromagnetic coil 221 from both sides of the computing device 202 in both the closed and reverse closed configurations. As such, the overlapping combination of electromagnetic coil 221 and the through-slots 210 and 214 form part of a substantially-non-magnetically-shielding through-channel 230 along the axis 220 from the exterior of the computing device portion 202 to the exterior of the computing device portion 204 in physical configurations of a reverse-closed position and a closed position, thereby providing multi-sided magnetic access to the electromagnetic coil 221 in the computing device 200. In some implementations, the through-channel 230 is also free of grounded components and/or ferrite so as to provide a substantially non-shielded magnetic path to and from the electromagnetic coil 221 from both sides of the closed or reverse-closed device via the through-channel 230.

Figure 3:
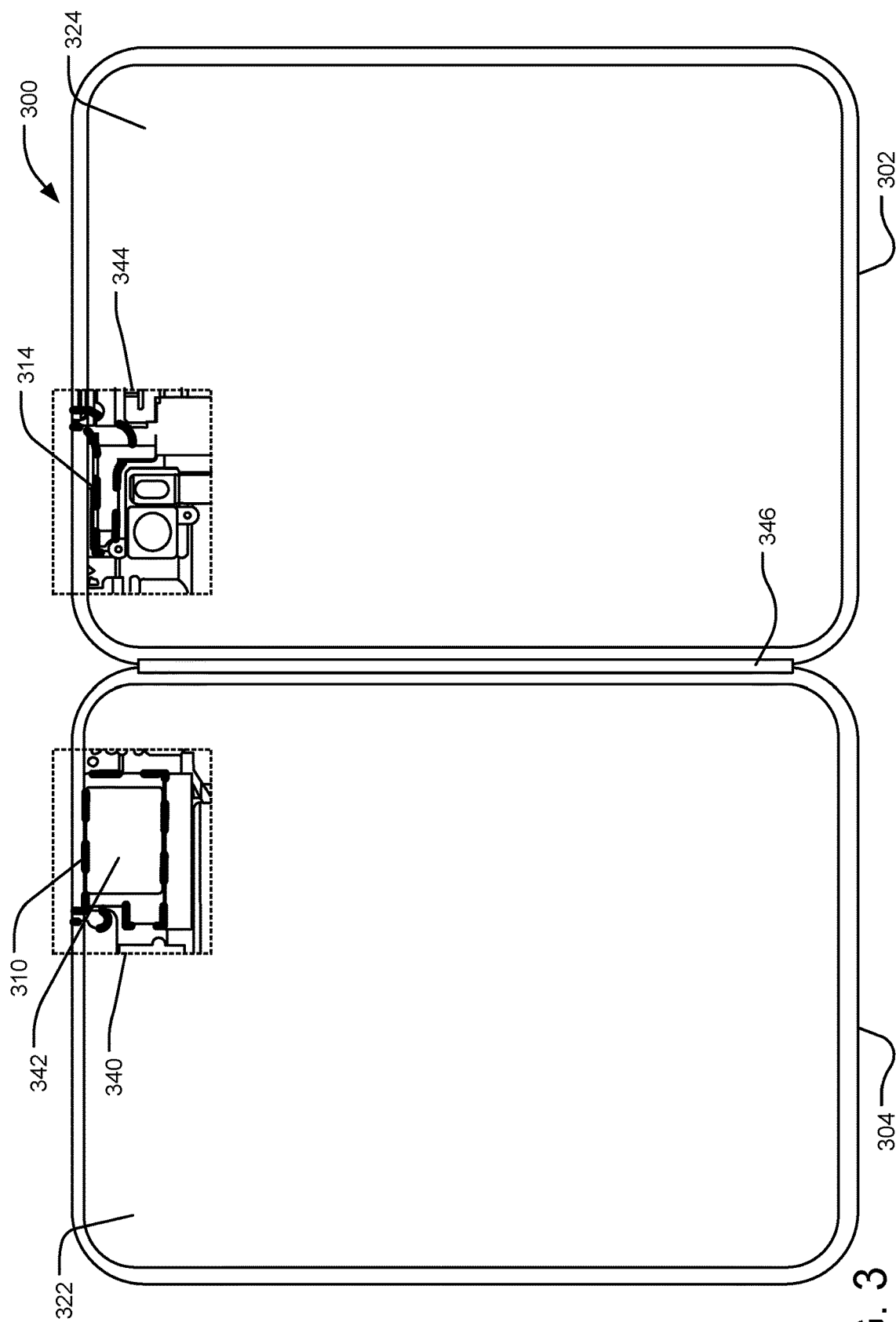
FIG. 3 illustrates an internal view of an example computing device chassis having multi-sided electromagnetic coil access in an open position, as seen from the display side.

FIG. 3 illustrates an internal view of an example computing device chassis 300 having multi-sided electromagnetic coil access in an open position, as seen from the display side. The computing device 300 includes a first half portion 304 and a second half portion 302. The internal view shows a metal frame 322 in the first half portion 304 and a metal frame 324 in the second half portion 302. The first half portion 304 and the second half portion 302 are connected by a mechanical joint (shown as hinge 346, although other joints are contemplated, including a prismatic joint providing a linear or nonlinear sliding connection).

The metal frame 322 includes a through-slot 310 (e.g., a milled aperture through the metal frame 324), shown as a bold dashed contour in a dashed detail box 340, which also shows some nearby structures, including non-grounded speaker 342 which is viewable through the through-slot 310 in FIG. 3 (Note: Other casing materials, buttons, displays, and other structures may obscure or cover the speaker 342 from view in an assembled device.) The metal frame 322 includes a through-slot 314 (e.g., a milled aperture through the metal frame 322), shown as a bold dashed contour in a dashed detail box 344, which also shows some nearby structures, including fasteners and electrical connections.

FIG. 3 illustrates that the through-slots 310 and 314 would overlap when the computing device 300 is folded about the hinge 346 to a closed or reverse-closed position.

Figure 4:
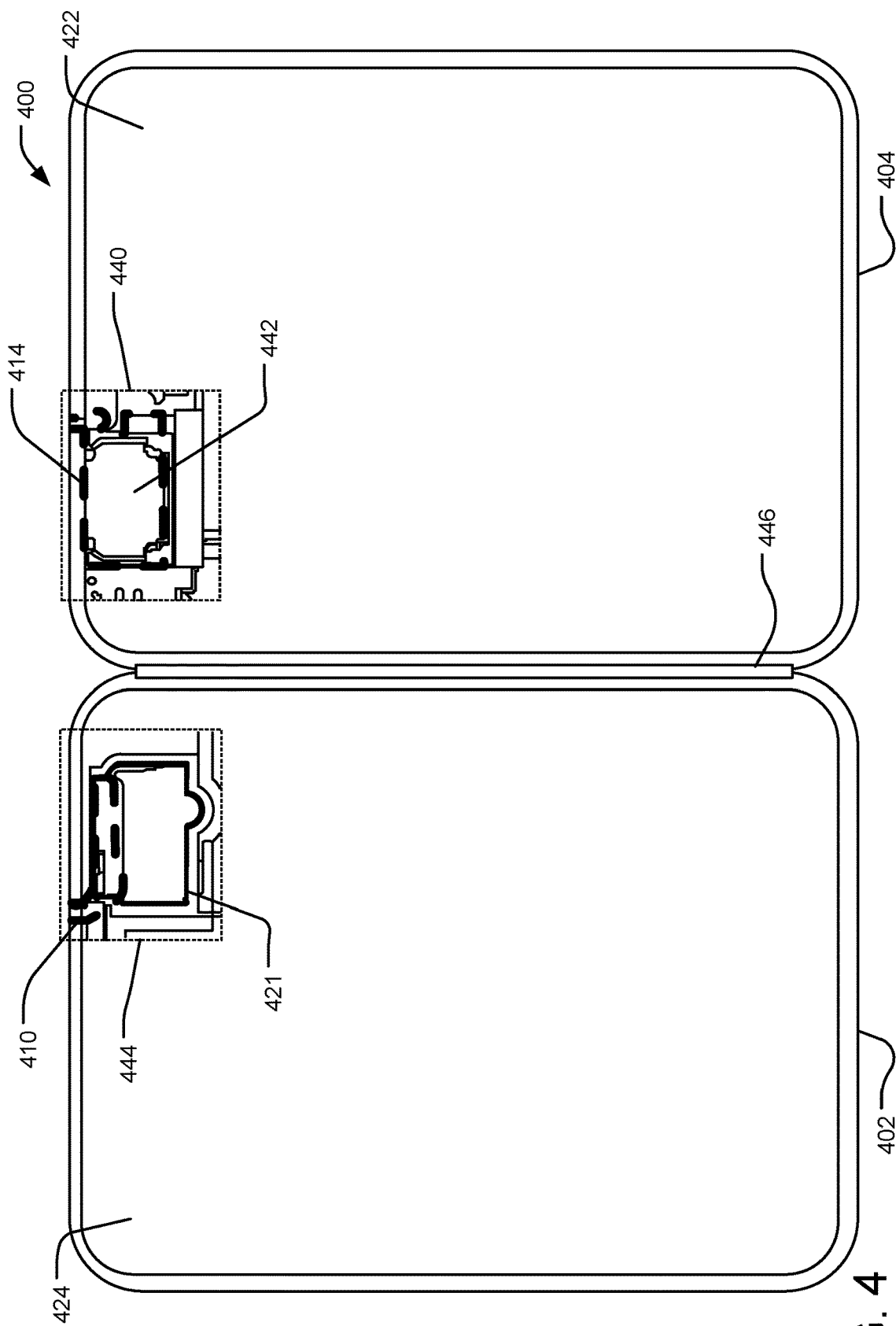
FIG. 4 illustrates an internal view of an example computing device chassis having multi-sided electromagnetic coil access in an open position, as seen from the non-display side.

FIG. 4 illustrates an internal view of an example computing device chassis 400 having multi-sided electromagnetic coil access in an open position, as seen from the non-display side. The computing device 400 includes a first half portion 404 and a second half portion 402. The internal view shows a metal frame 422 in the first half portion 404 and a metal frame 424 in the second half portion 402. The first half portion 404 and the second half portion 402 are connected by a mechanical joint (shown as hinge 446, although other joints are contemplated, including a prismatic joint providing a sliding connection).

The metal frame 422 includes a through-slot 410 (e.g., a milled aperture through the metal frame 422), shown as a bold dashed contour in a dashed detail box 440, which also shows some nearby structures, including non-grounded speaker 442 which is viewable through the through-slot 410 in FIG. 4 (Note: Other casing materials, buttons, displays, and other structures may obscure or cover the speaker 442 from view in an assembled device.) The metal frame 424 includes a through-slot 414 (e.g., a milled aperture through the metal frame 424), shown as a bold dashed contour in a dashed detail box 444, which also shows some nearby structures, including fasteners and electrical connections. An electromagnetic coil 421 is also shown as a bold solid line in the dashed detail box. FIG. 4 illustrates that the electromagnetic coil 421 and the through-slots 410 and 414 would overlap when the computing device 400 is folded about the hinge 446 to a closed or reverse-closed position. It should be noted that the two through-slots may be differently sized and shaped with respect to each other and with respect to the electromagnetic coil.

Figure 5:
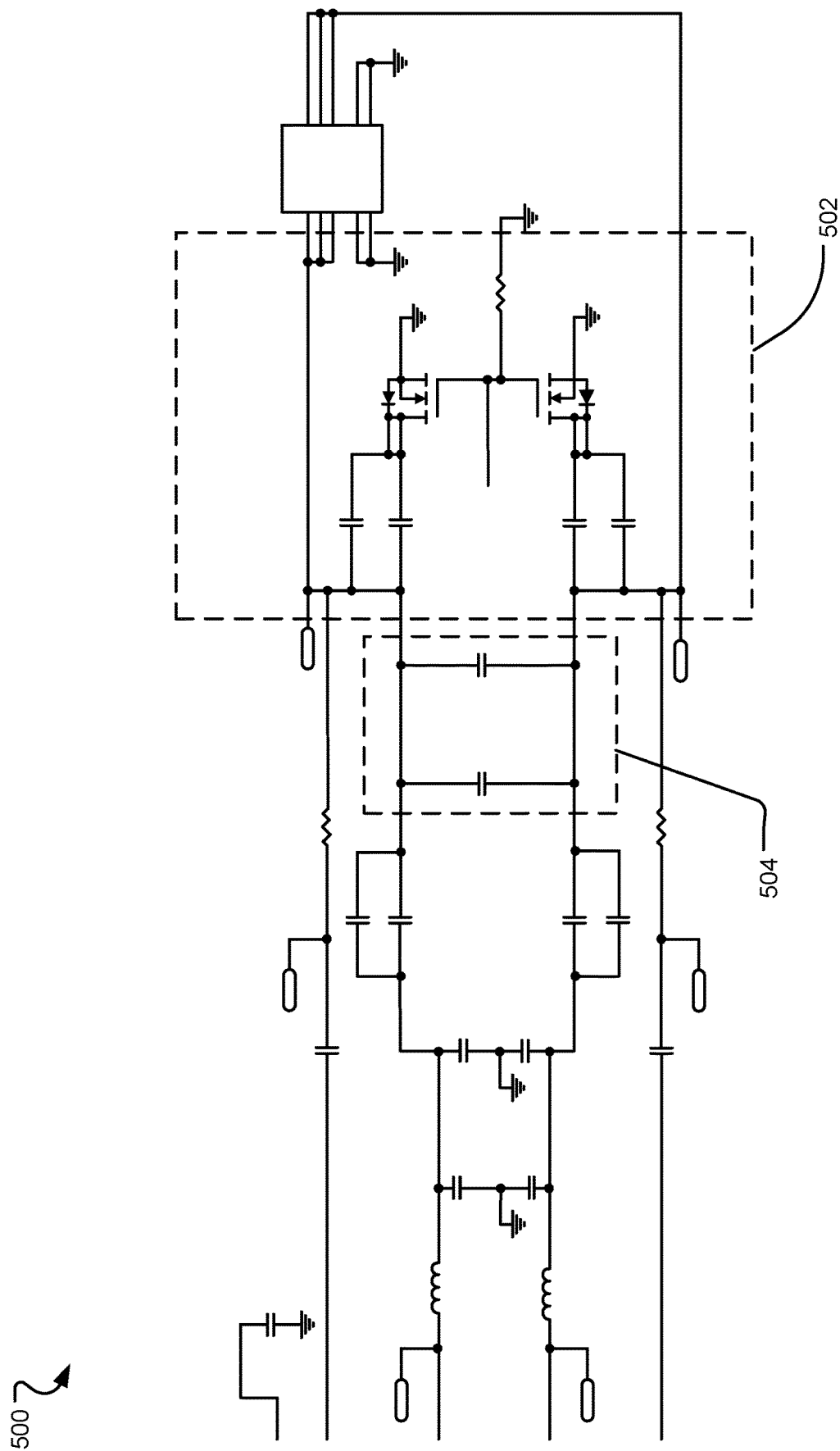
FIG. 5 illustrates circuitry in an example multi-configuration computing device for controlling electromagnetic coil operation.

FIG. 5 illustrates circuitry 500 in an example multi-configuration computing device for controlling electromagnetic coil operation. Different physical configurations of a computing device may have a different tuning state because the metal environment seen by the coil changes in different physical configurations. Accordingly, the induced eddy currents can differ from one physical configuration to another, resulting in a change in the inductance of the electromagnetic coil.

Accordingly, the circuitry 500 includes a matching selector circuitry (see, e.g., the switches within box 502) and adjustable matching circuitry (see, e.g., the capacitors within dashed boxes 502 and 504). In one implementation, as shown in FIG. 5, the switches within the box 502 add or remove capacitance within the box 504 in parallel with the capacitors within the box 502 to adjust the impedance matching between the electromagnetic coil (not shown) and electromagnetic coil interface circuitry (not shown), based on the detected physical configuration of the computing device (e.g., as detected by physical configuration detection circuitry).

In an alternative implementation, the capacitors with the box 502 may be omitted and the switches in the box 502 may be replaced with control circuitry to adjust variable capacitors within box 504 to adjust the impedance matching between the electromagnetic coil (not shown) and electromagnetic coil interface circuitry (not shown), based on the physical configuration of the computing device. Other variable impedance elements may be employed.

Such switches and control circuitry may be controlled by under control of one or more processor units. The electromagnetic coil interface circuitry may include Near Field Communications (NFC) circuitry, inductive charging circuitry, and other interfaces to the electromagnetic coil. Furthermore, the matching selector circuitry, the adjustable matching circuitry, and the configuration detection circuitry may be controlled by tuning firmware (e.g., system firmware, NFC firmware, inductive charging firmware) adjust matching in order to compensate for input voltage variations, Active Load Modulation (ALM) phase, DLMA (dynamic load modulation amplitude), and DPC (dynamic power control) as they change between different physical configurations.

Figure 6:
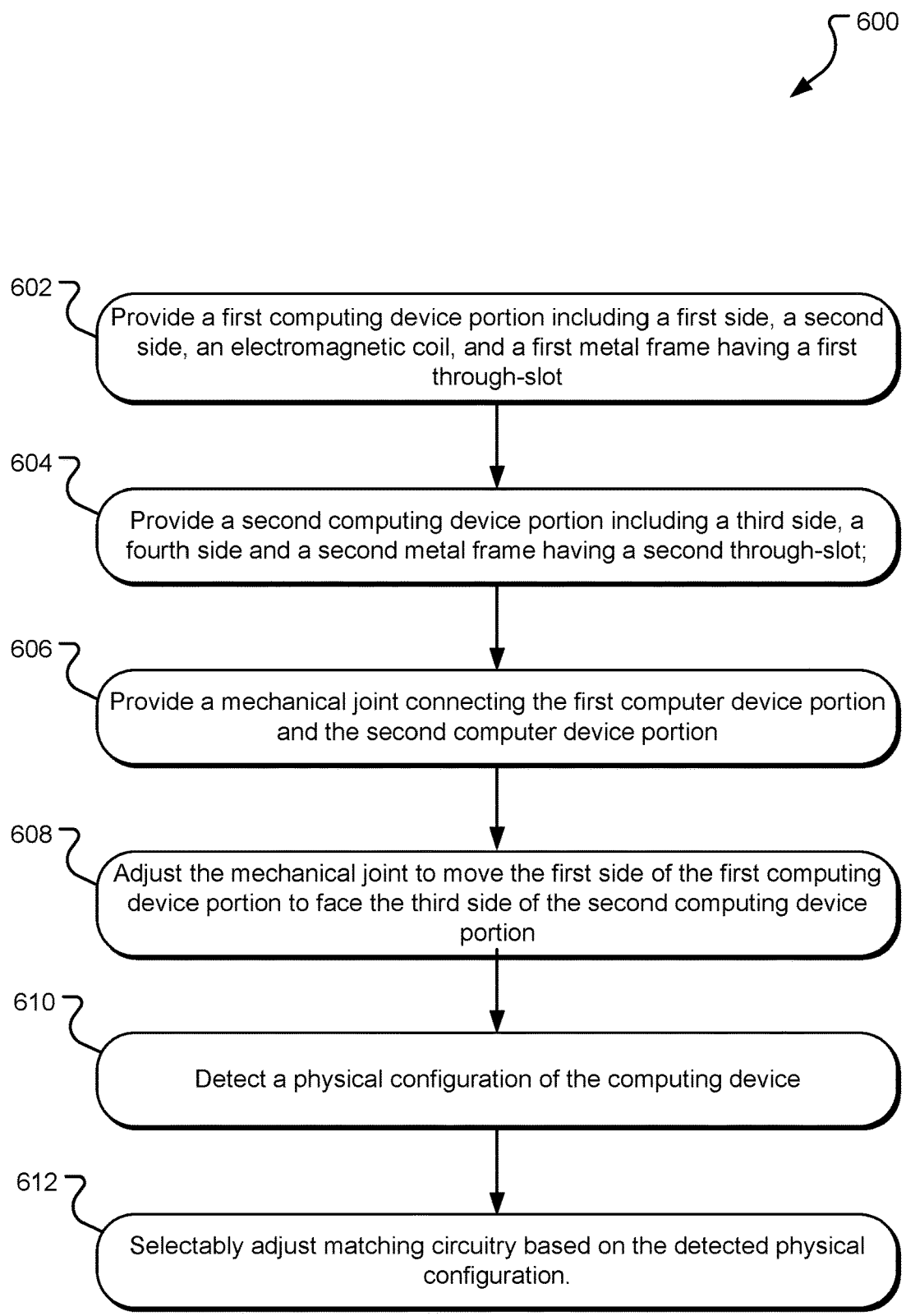
FIG. 6 illustrates operations for controlling electromagnetic coil operation in a multi-configuration computing device.

FIG. 6 illustrates operations 600 for controlling electromagnetic coil operation in a multi-configuration computing device. A providing operation 602 provides a first computing device portion with a metal frame having a first through-slot. The first computing device also includes a first side, a second side, and an electromagnetic coil.

Another providing operation 604 provides a second computing device portion with a metal frame having a second through-slot. The second computing device also includes a third side and a fourth side. Yet another providing operation 606 provides a mechanical joint, such as a rotating or articulating hinge, a prismatic hinge, and a flexible joint, that connects the first computing device portion to the second computing device portion.

An adjusting operation 608 adjusts the mechanical joint to move the first side of the first computing device portion to face the third side of the second computing device portion. The first and third sides may be display sides or non-display sides.

A detection operation 610 detects the physical configuration of the computing device, including an open position, a closed position, a reverse-closed position, or any other physical configuration permitted by the computing device and detectable by configuration detection circuitry. Another adjusting operation 612 selectively adjusts matching circuitry based on the detected physical configuration of the computing device to match the impedance between the electromagnetic coil and interface circuitry of the computing device.

Figure 7:
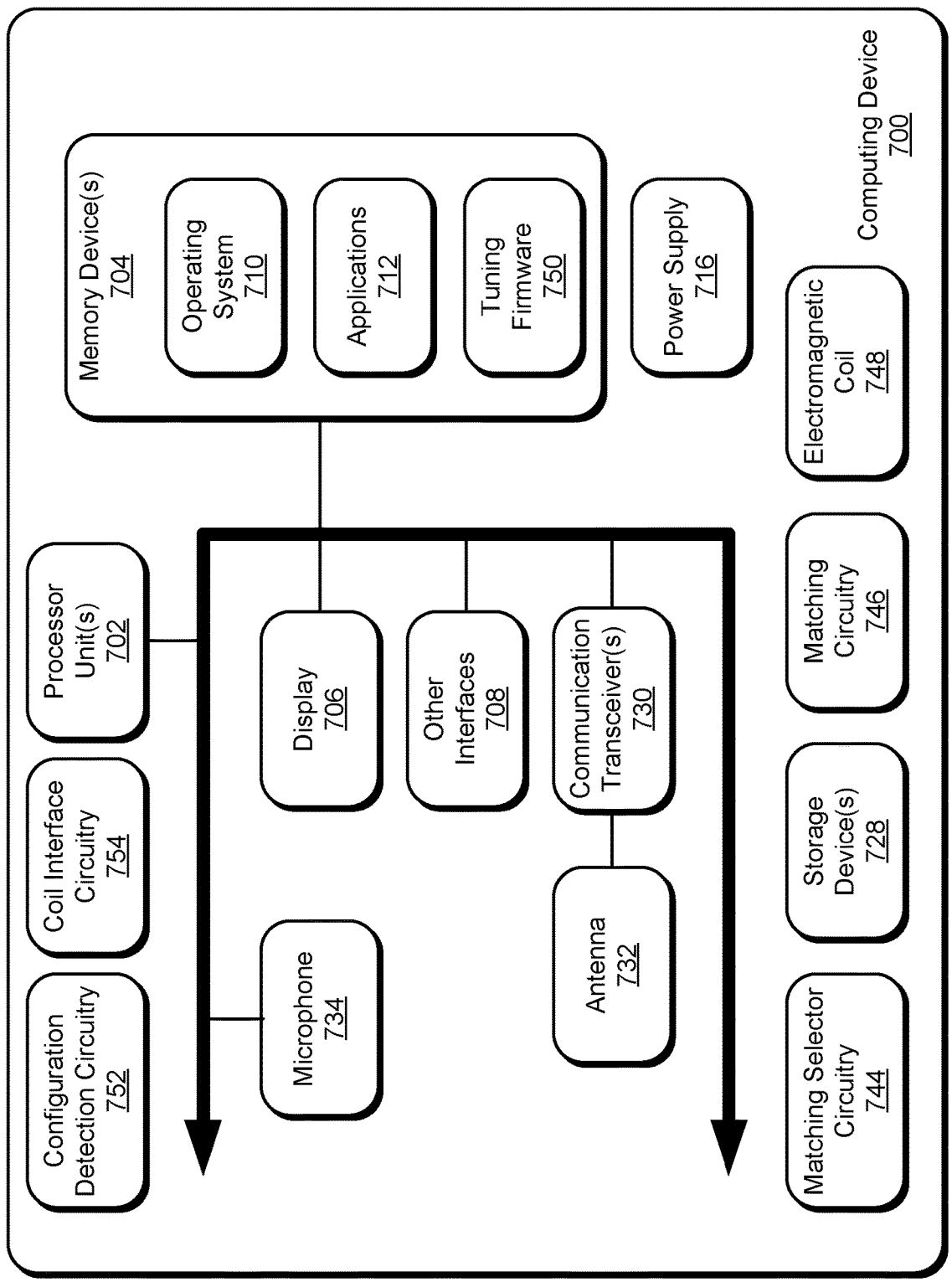
FIG. 7 illustrates an example computing device for use in controlling electromagnetic coil operation in a multi-configuration computing device.

FIG. 7 illustrates an example schematic of a computing device 700 configured to control electromagnetic coil operation. The computing device 700 includes one or more processor units 702, one or more memory devices 704, a display 706 (e.g., a touchscreen display or lights), a microphone 734, and other interfaces 708 (e.g., buttons). The memory device(s) 704 generally includes either or both of volatile memory (e.g., RAM) and non-volatile memory (e.g., flash memory). An operating system 710, such as the Microsoft Windows® operating system or the Microsoft Windows® Mobile operating system, resides in the memory 704 and is executed by the processor unit(s) 702, although it should be understood that other operating systems may be employed.

One or more applications 712 may be loaded in the memory device(s) 704 and executed on the operating system 710 by the processor unit(s) 702. Tuning firmware 750 is also loaded into the memory device(s) 704 and executed by the processor unit(s) 702. Alternatively, the tuning firmware 750 may be stored in part of the controller chip firmware. The computing device 700 includes a power supply 716, which is powered by one or more batteries or other power sources and which provides power to other components of the computing device 700. The power supply 716 may also be connected to an external power source that overrides or recharges the built-in batteries or other power sources.

The computing device 700 includes one or more communication transceivers 730 and an antenna 732 to provide network connectivity (e.g., a mobile phone network, Wi-Fi®, and BlueTooth®). The computing device 700 may also include various other components, such as a positioning system (e.g., a global positioning satellite transceiver), one or more accelerometers, one or more cameras, an audio interface (e.g., a microphone, an audio amplifier and speaker and/or audio jack), and one or more additional storage device(s) 728. Other configurations may also be employed.

In an example implementation, an operating system, 744, various applications, and other modules and services may be embodied by instructions stored in the memory device(s) 704 and/or storage device(s) 728 and processed by the processing unit(s) 702. Device settings, physical configuration parameters, impedance matching parameters, switching parameters, and other data may be stored in memory device(s) 704 and/or storage device(s) 728 as persistent datastores.

The computing device 700 includes configuration detection circuitry 752 that detects the physical configuration of the computing device, such as by detecting the angle of a hinge, detecting proximity of one computing device portion to another device portion, and/or other configuration detection methods. The computing device 700 also includes matching selector circuitry 744 coupled to matching circuitry 746. The matching circuitry 746 matches the impedance between an electromagnetic coil 748 and coil interface circuitry 754. The matching selector circuitry 744 controls the adjustment of the matching circuitry 746, such as by selectively connecting/disconnecting capacitors to the matching circuitry 746, adjusting the value of variable capacitors, and/or performing other matching adjustment operations. The matching selector circuitry 744 may selectively adjust the matching circuitry based on the physical configuration detected by the configuration detection circuitry 752.

The computing device 700 may include a variety of tangible computer-readable storage media and intangible computer-readable communication signals, or alternatively, tangible processor-readable storage media and intangible processor-readable communication signals. Tangible computer-readable storage and tangible processor-readable storage can be embodied by any available media that can be accessed by the computing device 700 and includes both volatile and nonvolatile storage media, removable and non-removable storage media. Tangible computer-readable/processor-readable storage media excludes intangible communications signals and includes volatile and nonvolatile, removable and non-removable storage media implemented in any method or technology for storage of information such as computer/processor readable instructions, data structures, program modules or other data. Tangible computer-readable/processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 700. In contrast to tangible computer-readable/processor-readable storage media, intangible computer-readable/processor-readable communication signals may embody computer/processor readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Figure 8A:
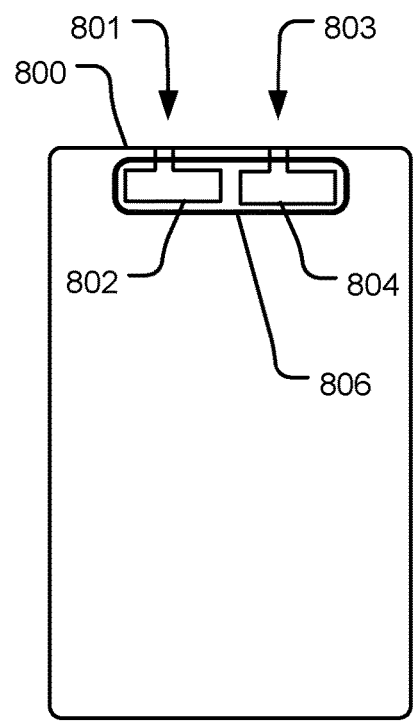

FIGS. 8A, 8B, 8C, and 8D illustrate various slot and coil designs in a computing device having multi-sided electromagnetic coil access. In FIG. 8A, a computing device 800 is folded in a closed position (e.g., closed or reverse-closed). An open through-slot 802 and an open through-slot 804 are shown, looking along an axis that is orthogonal to the plane (or the large flat surface) of the computing device 800. The through-slots are identified as "open" through-slots because the through-slots, which cut through metal frames of the computing device 800, also include open channels 801 and 803 to the outside of the metal frame or to some large interior aperture of the metal frame, rather than being fully closed cut shape.

An electromagnetic coil 806 is also shown. It should be understood that the through-slots 802 and 804 and the electromagnetic coil 806 are positioned on different planes in a cross-sectional view of the computing device 800, as shown in previous figures.

In the design shown in FIG. 8A, the two open through-slots 802 and 804 do not overlap with each other (along the orthogonal axis), but the electromagnetic coil 806 overlaps both of the open through-slots 802 and 804. In fact, as shown, the electromagnetic coil 806 completely overlaps or encompasses both of the open through-slots 802 and 804 along the axis, although partial overlapping would also be viable.

Figure 8B:
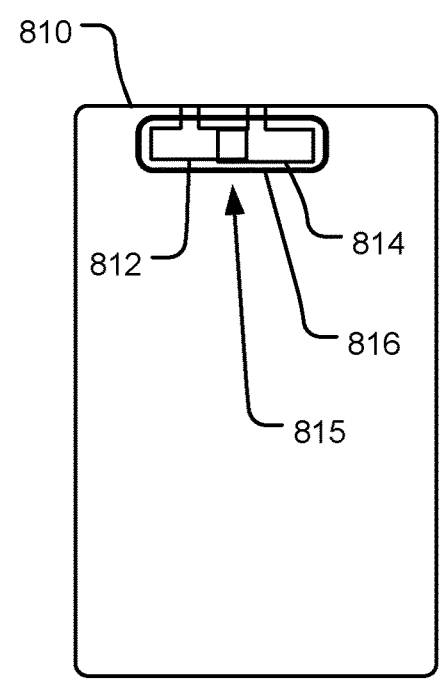

In FIG. 8B, a computing device 810 is folded in a closed position (e.g., closed or reverse-closed). An open through-slot 812 and an open through-slot 814 are shown, looking along an axis that is orthogonal to the plane (or the large flat surface) of the computing device 810.

An electromagnetic coil 816 is also shown. It should be understood that the through-slots 812 and 814 and the electromagnetic coil 816 are positioned on different planes in a cross-sectional view of the computing device 810, as shown in previous figures.

In the design shown in FIG. 8B, the two open through-slots 812 and 814 overlap with each other (at position 815, along the orthogonal axis) and the electromagnetic coil 816 overlaps both of the open through-slots 812 and 814. In fact, as shown, the electromagnetic coil 816 completely overlaps or encompasses both of the open through-slots 812 and 814 along the axis, although partial overlapping would also be viable.

Figure 8C:
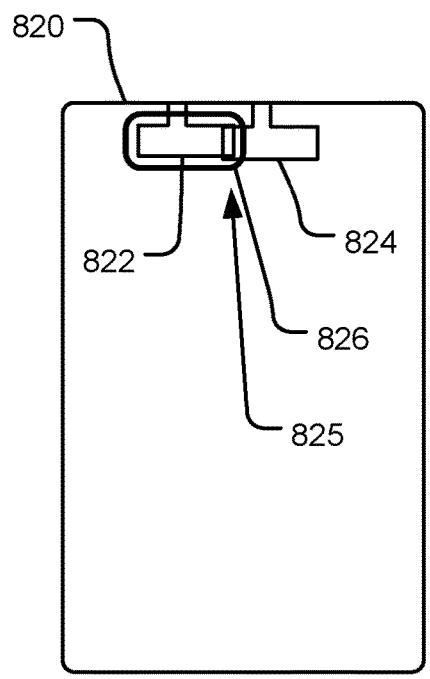

In FIG. 8C, a computing device 820 is folded in a closed position (e.g., closed or reverse-closed). An open through-slot 822 and an open through-slot 824 are shown, looking along an axis that is orthogonal to the plane (or the large flat surface) of the computing device 820.

An electromagnetic coil 826 is also shown. It should be understood that the through-slots 822 and 824 and the electromagnetic coil 826 are positioned on different planes in a cross-sectional view of the computing device 820, as shown in previous figures.

In the design shown in FIG. 8C, the two open through-slots 822 and 824 overlap with each other (at position 825, along the orthogonal axis) and the electromagnetic coil 826 overlaps both of the open through-slots 822 and 824. In fact, as shown, the electromagnetic coil 826 completely overlaps or encompasses the open through-slot 822 along the axis and partially overlaps the open through-slot 824 along the axis.

Figure 8D:
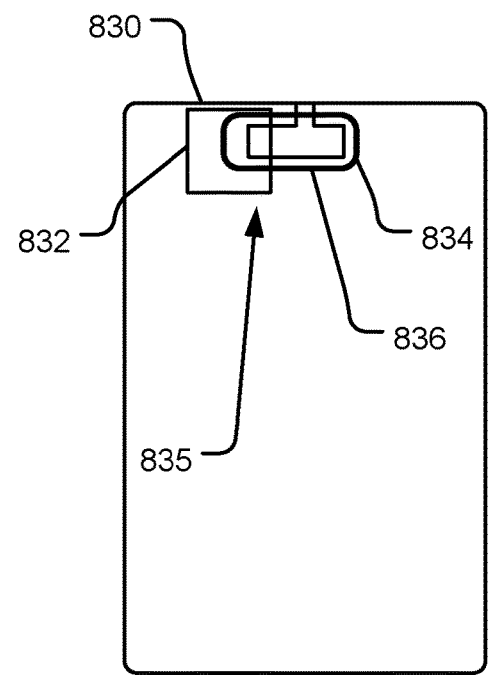

In FIG. 8D, a computing device 830 is folded in a closed position (e.g., closed or reverse-closed). A closed through-slot 832 and an open through-slot 834 are shown, looking along an axis that is orthogonal to the plane (or the large flat surface) of the computing device 830. The closed through-slot 832 is closed, in that it does not provide an open channel to the side of the metal frame.

An electromagnetic coil 836 is also shown. It should be understood that the through-slots 832 and 834 and the electromagnetic coil 8\36 are positioned on different planes in a cross-sectional view of the computing device 830, as shown in previous figures.

In the design shown in FIG. 8D, the two through-slots 832 and 834 overlap with each other (at position 835, along the orthogonal axis) and the electromagnetic coil 836 overlaps both of the open through-slots 832 and 834. In fact, as shown, the electromagnetic coil 836 completely overlaps or encompasses the open through-slot 834 along the axis and partially overlaps the closed through-slot 832 along the axis. Other slots and coil designs are also contemplated.

An example computing device includes a first computing device portion including one or more electrical components, a first side, a second side, an electromagnetic coil, and a first metal frame having a first through-slot. A second computing device portion includes one or more other electrical components, a third side, a fourth side and a second metal frame having a second through-slot. A mechanical joint connects the first computing device portion and the second computing device portion. The first side is positioned to face the third side, wherein the electromagnetic coil overlaps both the first through-slot and the second through-slot along an axis running orthogonal to the first computing device portion and the second computing device portion.

Another example computing device of any preceding computing device provides the mechanical joint as a hinge foldably connecting the first computing device portion and the second computing device portion across a range of fold angles between the first computing device portion and the second computing device portion.

Another example computing device of any preceding computing device provides the mechanical joint as a flexible connector foldably connecting the first computing device portion and the second computing device portion across a range of fold angles between the first computing device portion and the second computing device portion.

Another example computing device of any preceding computing device provides the mechanical joint as a prismatic joint providing a linear sliding connection between the first computing device portion and the second computing device portion.

Another example computing device of any preceding computing device provides the first computing device portion as including a display on the first side and the second computing device portion includes a display on the third side.

Another example computing device of any preceding computing device provides the first computing device portion as including a display on the second side and the second computing device portion includes a display on the fourth side.

Another example computing device of any preceding computing device further includes electromagnetic coil interface circuitry connected to the electromagnetic coil.

Another example computing device of any preceding computing device provides the electromagnetic coil interface circuitry as near field communication circuitry connected to the electromagnetic coil.

Another example computing device of any preceding computing device provides the electromagnetic coil interface circuitry as inductive charging circuitry connected to the electromagnetic coil.

Another example computing device of any preceding computing device further includes one or more processor units within one or both of the first computing device portion and the second computing device portion and adjustable matching circuitry coupled to the electromagnetic coil interface circuitry and configured to match impedance of the electromagnetic coil to the electromagnetic coil interface circuitry.

Another example computing device of any preceding computing device further includes configuration detection circuitry configured to detect a physical configuration of the computing device. The physical configuration is dependent upon a position of the mechanical joint. Matching selector circuitry is coupled to the adjustable matching circuitry and the configuration detection circuitry. The matching selector circuitry is configured to adjust the adjustable matching circuitry based on the detected physical configuration.

Another example computing device of any preceding computing device further includes one or more tangible processor-readable storage media within one or both of the first computing device portion and the second computing device portion. The one or more tangible processor-readable storage media stores instructions for selectively adjusting via the matching selector circuitry the adjustable matching circuitry based on the detected physical configuration.

Another example computing device of any preceding computing device provides an overlapping combination of the first through-slot and the second through-slot as part of a substantially non-shielding through-channel along the axis from an exterior of the first computing device portion to an exterior of the second computing device portion in physical configurations of a reverse-closed position and a closed position.

An example method provides a first computing device portion including one or more electrical components, a first side, a second side, an electromagnetic coil, and a first metal frame having a first through-slot. The method provides a second computing device portion that includes one or more other electrical components, a third side, a fourth side and a second metal frame having a second through-slot. The method provides a mechanical joint that connects the first computing device portion and the second computing device portion. The method adjusts the mechanical joint to move the first side of the first computing device portion to face the third side of the second computing device portion, wherein an electromagnetic coil overlaps both the first through-slot and the second through-slot along an axis running orthogonal to the first computing device portion and the second computing device portion.

Another example method of any preceding method provides electromagnetic coil interface circuitry connected to the electromagnetic coil.

Another example method of any preceding method provides the electromagnetic coil interface circuitry to include near field communication circuitry or inductive charging circuitry connected to the electromagnetic coil.

Another example method of any preceding method further includes adjusting matching circuitry coupled to the electromagnetic coil interface circuitry to match impedance of the electromagnetic coil to the electromagnetic coil interface circuitry.

Another example method of any preceding method includes the adjusting operation to include detecting a physical configuration of the computing device, the physical configuration being dependent upon a position of the mechanical joint, and adjusting the matching circuitry based on the detected physical configuration.

Another example method of any preceding method includes the adjusting operation to include selectively adjusting the matching circuitry based on the detected physical configuration.

An example system includes means for providing a first computing device portion including one or more electrical components, a first side, a second side, an electromagnetic coil, and a first metal frame having a first through-slot. The system includes means for providing a second computing device portion that includes one or more other electrical components, a third side, a fourth side and a second metal frame having a second through-slot. The system includes means for providing a mechanical joint that connects the first computing device portion and the second computing device portion. The system includes means for adjusting the mechanical joint to move the first side of the first computing device portion to face the third side of the second computing device portion, wherein an electromagnetic coil overlaps both the first through-slot and the second through-slot along an axis running orthogonal to the first computing device portion and the second computing device portion.

Another example system of any preceding method includes means for providing electromagnetic coil interface circuitry connected to the electromagnetic coil.

Another example system of any preceding method includes means for providing the electromagnetic coil interface circuitry to include near field communication circuitry or inductive charging circuitry connected to the electromagnetic coil.

Another example system of any preceding method includes means for adjusting matching circuitry coupled to the electromagnetic coil interface circuitry to match impedance of the electromagnetic coil to the electromagnetic coil interface circuitry.

Another example system of any preceding method provides the means for adjusting matching circuitry to include detecting a physical configuration of the computing device, the physical configuration being dependent upon a position of the mechanical joint, and means for adjusting the matching circuitry based on the detected physical configuration.

Another example system of any preceding method provides the means for adjusting operation to include selectively adjusting the matching circuitry based on the detected physical configuration.

An example computing device chassis includes a first computing device portion including a first side, a second side, an electromagnetic coil, and a first metal frame having a first through-slot. A second computing device portion includes a third side, a fourth side and a second metal frame having a second through-slot. A mechanical joint connects the first computing device portion and the second computing device portion, the first side being positioned to face the third side, wherein the electromagnetic coil overlaps both the first through-slot and the second through-slot overlap along an axis running orthogonal to the first computing device portion and the second computing device portion.

Some embodiments may comprise an article of manufacture. An article of manufacture may comprise a tangible computer-readable/processor-readable storage medium to store logic. Examples of such a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer/processor program instructions may include any suitable types of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

What is claimed is:

1. A computing device comprising:
   a first computing device portion including one or more electrical components, a first side, a second side, an electromagnetic coil, and a first metal frame having a first through-slot;
   a second computing device portion including one or more other electrical components, a third side, a fourth side and a second metal frame having a second through-slot;
   electromagnetic coil interface circuitry connected to the electromagnetic coil;
   adjustable matching circuitry coupled to the electromagnetic coil interface circuitry and configured to match impedance of the electromagnetic coil to the electromagnetic coil interface circuitry; and
   a mechanical joint connecting the first computing device portion and the second computing device portion, the first side being positioned to face the third side, wherein the electromagnetic coil overlaps both the first through-slot and the second through-slot along an axis running orthogonal to the first computing device portion and the second computing device portion.

2. The computing device of claim 1 wherein the mechanical joint includes a hinge foldably connecting the first computing device portion and the second computing device portion across a range of fold angles between the first computing device portion and the second computing device portion.

3. The computing device of claim 1 wherein the mechanical joint includes a flexible connector foldably connecting the first computing device portion and the second computing device portion across a range of fold angles between the first computing device portion and the second computing device portion.

4. The computing device of claim 1 wherein the mechanical joint includes a prismatic joint providing a linear sliding connection between the first computing device portion and the second computing device portion.

5. The computing device of claim 1 wherein the first computing device portion includes a display on the first side and the second computing device portion includes a display on the third side.

6. The computing device of claim 1 wherein the first computing device portion includes a display on the second side and the second computing device portion includes a display on the fourth side.

7. The computing device of claim 1 wherein the electromagnetic coil interface circuitry includes near field communication circuitry connected to the electromagnetic coil.

8. The computing device of claim 1 wherein the electromagnetic coil interface circuitry includes inductive charging circuitry connected to the electromagnetic coil.

9. The computing device of claim 1 further comprising:
one or more processor units within one or both of the first computing device portion and the second computing device portion.

10. The computing device of claim 9 further comprising:
configuration detection circuitry configured to detect a physical configuration of the computing device, the physical configuration being dependent upon a position of the mechanical joint; and
matching selector circuitry coupled to the adjustable matching circuitry and the configuration detection circuitry, the matching selector circuitry being configured to adjust the adjustable matching circuitry based on the detected physical configuration.

11. The computing device of claim 10 further comprising:
one or more tangible processor-readable storage media within one or both of the first computing device portion and the second computing device portion, the one or more tangible processor-readable storage media storing instructions for selectively adjusting via the matching selector circuitry the adjustable matching circuitry based on the detected physical configuration.

12. The computing device of claim 1 wherein an overlapping combination of the first through-slot and the second through-slot is part of a substantially non-shielding through-channel along the axis from an exterior of the first computing device portion to an exterior of the second computing device portion in physical configurations of a reverse-closed position and a closed position.

13. The computing device of claim 1, wherein the overlapping arrangement of the electromagnetic coil and both of the first through-slot and the second through-slot when the first side is positioned to face the third side allows external non-shielded magnetic access to the electromagnetic coil along the axis from both the second side and the fourth side the facing computing device portions.

14. The computing device of claim 1, wherein the overlapping arrangement of the electromagnetic coil and both of the first through-slot and the second through-slot positions the first through-slot and the second through-slot on opposite sides of the electromagnetic coil.

15. A method comprising:
providing a first computing device portion including one or more electrical components, a first side, a second side, an electromagnetic coil, and a first metal frame having a first through-slot;
providing a second computing device portion including one or more other electrical components, a third side, a fourth side and a second metal frame having a second through-slot;
providing a mechanical joint connecting the first computing device portion and the second computing device portion;
adjusting the mechanical joint to move the first side of the first computing device portion to face the third side of the second computing device portion, wherein the electromagnetic coil overlaps both the first through-slot and the second through-slot along an axis running orthogonal to the first computing device portion and the second computing device portion; and
adjusting matching circuitry coupled to electromagnetic coil interface circuitry to match impedance of the electromagnetic coil to the electromagnetic coil interface circuitry.

16. The method of claim 15 wherein electromagnetic coil interface circuitry is connected to the electromagnetic coil.

17. The method of claim 16 wherein the electromagnetic coil interface circuitry includes near field communication circuitry or inductive charging circuitry connected to the electromagnetic coil.

18. The method of claim 16 further comprising:
adjusting matching circuitry coupled to the electromagnetic coil interface circuitry to match impedance of the electromagnetic coil to the electromagnetic coil interface circuitry.

19. The method of claim 18 wherein the adjusting operation comprises:
detecting a physical configuration of the computing device, the physical configuration being dependent upon a position of the mechanical joint; and
adjusting the matching circuitry based on the detected physical configuration.

20. The method of claim 19 wherein the adjusting operation comprises:
selectively adjusting the matching circuitry based on the detected physical configuration.

21. A computing device chassis comprising:
a first computing device portion including a first side, a second side, an electromagnetic coil, and a first metal frame having a first through-slot;
a second computing device portion including a third side, a fourth side and a second metal frame having a second through-slot;
electromagnetic coil interface circuitry connected to the electromagnetic coil;
adjustable matching circuitry coupled to the electromagnetic coil interface circuitry and configured to match impedance of the electromagnetic coil to the electromagnetic coil interface circuitry; and
a mechanical joint connecting the first computing device portion and the second computing device portion, the first side being positioned to face the third side, wherein the electromagnetic coil overlaps both the first through-slot and the second through-slot overlap along an axis running orthogonal to the first computing device portion and the second computing device portion.

* * * * *